United States Patent
Chong et al.

(10) Patent No.: US 8,183,612 B2
(45) Date of Patent: May 22, 2012

(54) OPTICAL RECEIVER AND METHOD OF FORMING THE SAME

(75) Inventors: Young-Jun Chong, Daejeon (KR); Eun-Soo Nam, Daejeon (KR); Jae-Sik Sim, Daejeon (KR); Yong-Hwan Kwon, Daejeon (KR); Bong-Ki Mheen, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 9 days.

(21) Appl. No.: 12/498,918

(22) Filed: Jul. 7, 2009

(65) Prior Publication Data

US 2010/0140662 A1    Jun. 10, 2010

(51) Int. Cl.
*H01L 29/72* (2006.01)

(52) U.S. Cl. ........ 257/300; 257/184; 257/197; 257/432; 257/436; 257/447; 257/460

(58) Field of Classification Search .............. 257/300, 257/184, 197, 432, 436, 447, 460
See application file for complete search history.

(56) References Cited

U.S. PATENT DOCUMENTS

| | | | |
|---|---|---|---|
| 5,063,426 A | | 11/1991 | Chandrasekhar et al. |
| 5,684,308 A | * | 11/1997 | Lovejoy et al. ............ 257/184 |
| 6,310,368 B1 | * | 10/2001 | Yagura ..................... 257/197 |
| 6,689,667 B2 | | 2/2004 | Nam et al. |
| 2004/0184495 A1 | * | 9/2004 | Kondo ....................... 372/36 |
| 2006/0205127 A1 | * | 9/2006 | Kwon et al. ............... 438/172 |
| 2009/0315073 A1 | * | 12/2009 | Shi et al. .................... 257/185 |

FOREIGN PATENT DOCUMENTS

KR    10-0440253    7/2004

OTHER PUBLICATIONS

K. Takahata et al., "10-Gb/s Two-Channel Monolithic Photoreceiver Array Using Waveguide p-i-n. PD's and HEMT's", IEEE Photonics Technology Letters, vol. 8, No. 4, Apr. 1996, pp. 563-565.
S. Chandrasekhar et al., "A Monolithic Long Wavelength Photoreceiver Using Heterojunction Bipolar Transistors", IEEE Journal of Quantum Electronics, vol. 27. No. 3. Mar. 1991, pp. 773-777.

* cited by examiner

*Primary Examiner* — Edward Wojciechowicz
(74) *Attorney, Agent, or Firm* — Rabin & Berdo, P.C.

(57) ABSTRACT

Provided are an optical receiver and a method of forming the same. The optical receiver includes a lens, a photo detector, and a hetero-junction bipolar transistor. The lens is attached to a backside of a substrate. The photo detector is disposed on a top surface of the substrate. The hetero-junction bipolar transistor is disposed on the top surface of the substrate. The lens condenses an incident optical signal to transmit the condensed optical signal to the photo detector.

6 Claims, 3 Drawing Sheets

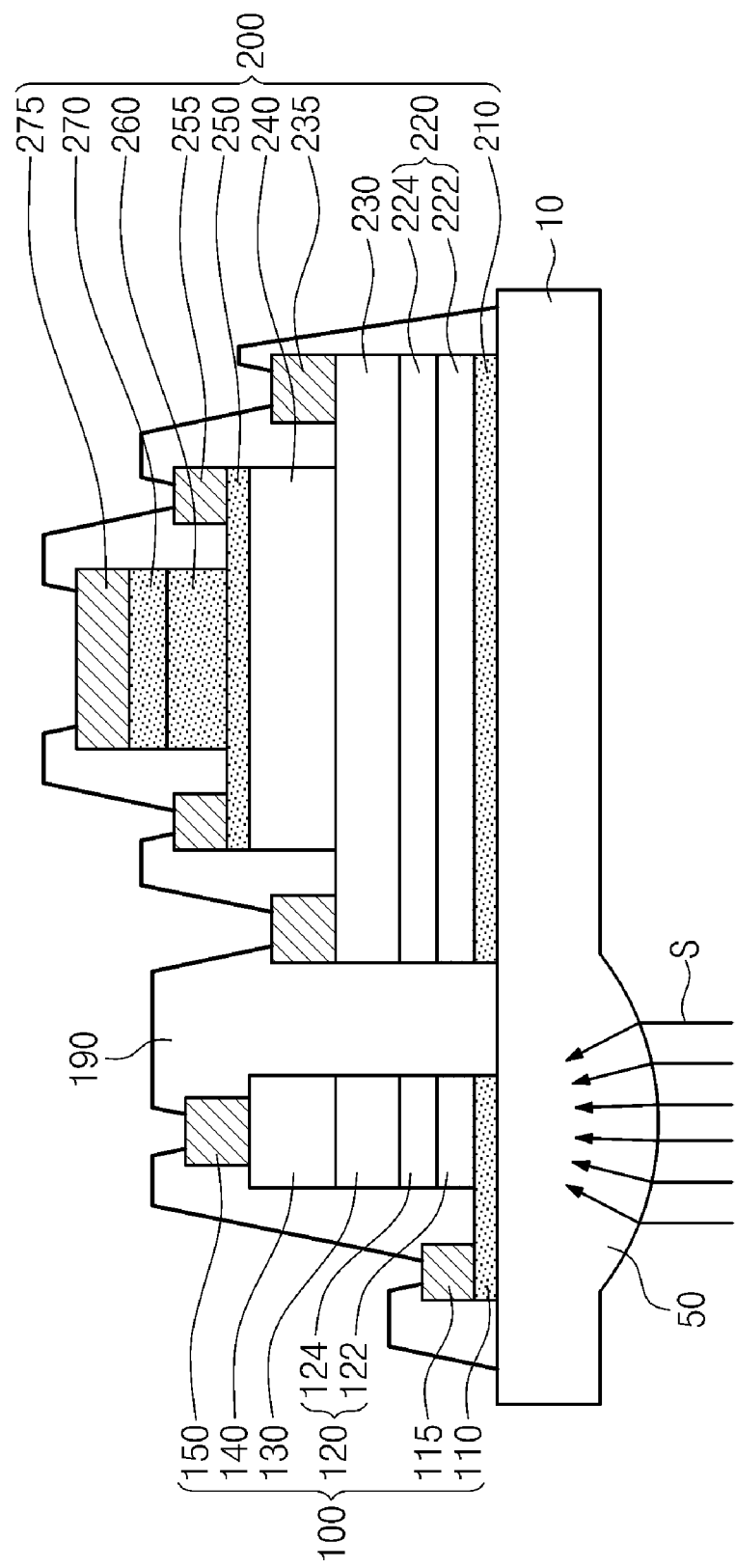

OPTICAL RECEIVER AND METHOD OF FORMING THE SAME

CROSS-REFERENCE TO RELATED APPLICATIONS

This U.S. non-provisional patent application claims priority under 35 U.S.C. §119 of Korean Patent Application Nos. 10-2008-0124022, filed on Dec. 8, 2008, and 10-2009-0026352, filed on Mar. 27, 2009, the entire contents of which are hereby incorporated by reference.

BACKGROUND OF THE INVENTION

The present invention disclosed herein relates to an optical receiver and a method of forming the same, and more particularly, to an optical receiver including an optical detector and a hetero-junction bipolar transistor and a method of forming the same.

A photo detector is a device that uses an internal photoelectric effect, i.e., a method in which an injected photon makes an electron and a hole that are free charge carriers in a semiconductor. For example, such a device includes a p-n junction photodiode, a positive intrinsic negative (PIN) photodiode, and an avalanche photodiode.

An optical receiver mainly used in a laser radar system may have a structure in which the PIN photodiode and a hetero-junction bipolar transistor are integrated. However, the photo detector of the optical receiver does not easily adjust an electric field applied to an In(0.53)Ga(0.47)As layer in which a band gap for absorbing light is very narrow. Thus, since a leakage current is generated by a tunneling effect, the applied the electric field is limited in density. In addition, since an amount of the light incident onto a surface of the photo detector is limited, the light missing the surface of the photo detector is lost, thereby decreasing external quantum efficiency.

Since the PIN photodiode does not generally have a gain when an optical signal is electrically converted, it is difficult to manufacture an optical receiver in which a photo detector having superior receive sensitivity is integrated.

SUMMARY OF THE INVENTION

The present invention provides an optical receiver having improved external quantum efficiency and a method of forming the same.

Embodiments of the present invention provide optical receivers including: a lens disposed to a backside of a substrate; a photo detector on a top surface of the substrate; and a hetero-junction bipolar transistor on the top surface of the substrate, wherein the lens condenses an incident optical signal to transmit the condensed optical signal to the photo detector.

In some embodiments, the photo detector may include: a multiplication layer on the substrate; and an absorption layer on the multiplication layer.

In other embodiments, the multiplication layer may include a p-type InAlAs layer and an n-type InAlAs layer.

In still other embodiments, the absorption layer may include an n-type InGaAs layer.

In even other embodiments, the photo detector may further include: an ohmic layer between the substrate and the multiplication layer, the ohmic layer being formed of p-type InGaAsP; and a current movement layer on the absorption layer, the current movement layer being formed of n-type InGaAs.

In yet other embodiments, the hetero-junction bipolar transistor may include: a sub-collector layer on the substrate; and a collector layer on the sub-collector layer, wherein the sub-collector layer is formed of the same material as the absorption layer, and the collector layer is formed of the same material as the current movement layer.

In further embodiments, the hetero-junction bipolar transistor may include: a first dummy layer between the sub-collector layer and the substrate; and a second dummy layer between the first dummy layer and the sub-collector layer, wherein the first dummy layer is formed of the same material as the ohmic layer, and the second dummy layer is formed of the same material as the multiplication layer.

In other embodiments of the present invention, methods of forming an optical receiver include preparing a substrate including a first region and a second region; forming a lens on a backside of the substrate including the first region; forming a photo detector on a top surface of the substrate including the first region; and forming a hetero-junction bipolar transistor on a top surface of the substrate including the second region.

In some embodiments, the forming of the photo detector and the hetero-junction bipolar transistor may include: forming a p$^+$-type InGaAsP layer in the first and second regions of the substrate; forming a p$^+$-type InAlAs layer on the p$^+$-type InGaAsP layer; forming an n$^+$-type InAlAs layer on the p$^+$-type InAlAs layer; forming an n$^+$-type InGaAs layer on the n$^+$-type InAlAs layer; and forming an n$^-$-type InGaAs layer on the n$^+$-type InGaAs layer.

In other embodiments, the forming of the photo detector may further include respectively patterning the p$^+$-type InGaAsP layer in the first region, p$^+$-type InAlAs layer, the n$^+$-type InAlAs layer, the n$^+$-type InGaAs layer, and the n$^-$-type InGaAs layer to form an ohmic layer on the substrate, a p-type multiplication layer on the ohmic layer, an n-type multiplication layer on the p-type multiplication layer, an absorption layer on the n-type multiplication layer, and a current movement layer on the absorption layer.

In still other embodiments, the forming of the hetero-junction bipolar transistor may further include: forming a p$^+$-type InGaAs layer on the n$^-$-type InGaAs layer of the second region; forming an n$^-$-type InP layer on the p$^+$-type InGaAs layer; and forming an n$^+$-type InGaAs layer on the n$^-$-type InP layer.

In even other embodiments, the forming of the hetero-junction bipolar transistor may further include: patterning the p$^+$-type InGaAsP layer to form a first dummy layer; respectively patterning the p$^+$-type InAlAs layer and n$^+$-type InAlAs layer to form a p-type dummy layer and an n-type dummy layer; patterning the n$^+$-type InGaAs layer to form a sub-collector layer; and patterning the n$^-$-type InGaAs layer to form a collector layer.

In yet other embodiments, the forming of the hetero-junction bipolar transistor may further include: patterning the n$^+$-type InGaAs layer to form a base layer on the collector layer; patterning the n$^-$-type InP layer to form an emitter layer on the base layer; and patterning the n$^+$-type InGaAs layer to form an emitter ohmic layer on the emitter layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 1 is a view of an optical receiver in which a photo detector and a hetero-junction bipolar transistor are integrated according to an embodiment of the present invention.

DETAILED DESCRIPTION OF PREFERRED EMBODIMENTS

Figure 2A:
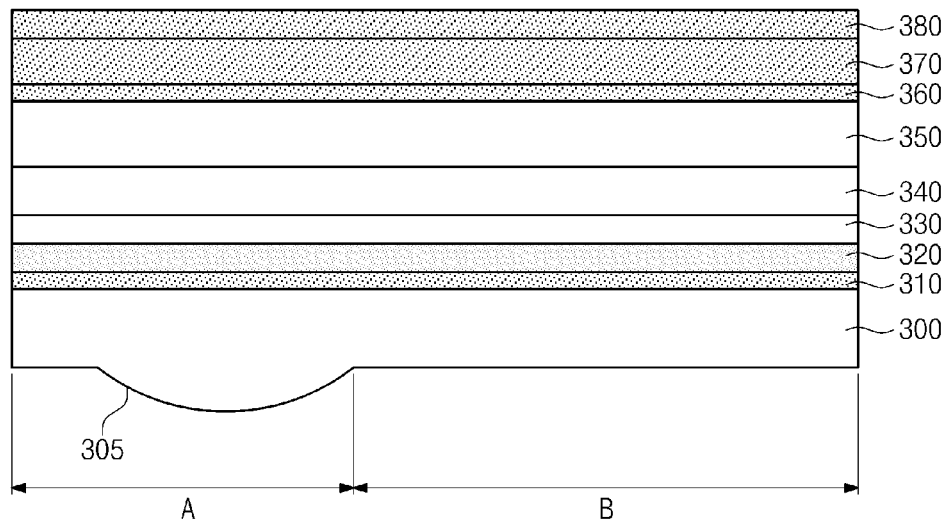
FIGS. 2A to 2C are views illustrating a method of forming an optical receiver according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms first and second are used herein to describe various elements, these elements should not be limited by these terms. These terms are only used to distinguish one element from another element.

In the figures, respective components are exaggerated for clarity of illustration. Like reference numerals refer to like elements throughout.

For brief descriptions, several embodiments that can applicable the scope of the present invention will be illustratively described, and descriptions of various modified embodiments will be omitted herein. However, those skilled in the art may apply the scope of the present invention to various cases based on the above-described descriptions and the illustrated embodiments.

FIG. 1 is a view of an optical receiver in which a photo detector and a hetero-junction bipolar transistor are integrated according to an embodiment of the present invention.

Referring to FIG. 1, a lens 50 is disposed to a backside of a substrate 10. A photo detector 100 and a hetero-junction bipolar transistor 200 are disposed on a top surface of the substrate 10. The lens 50 condenses an incident optical signal S to transmit the condensed optical signal S to the photo detector 100. Since light of a region missing a surface of the photo detector 100 may be condensed by the lens 50, external quantum efficiency may be improved.

The photo detector 100 may include a multiplication layer 120 on the substrate 10 and an absorption layer 130 on the multiplication layer 120. A p-type InAlAs layer 122 and an n-type InAlAs layer 124 may be stacked together to form the multiplication layer 120 having a p-n junction structure. The absorption layer 130 may include an n-type InGaAs layer. The absorption layer 130 may absorbs the optical signal S incident through the lens 50 to generate an electric charge. The multiplication layer 120 may multiply the electric charge generated in the absorption layer 130. That is, the photo detector 100 may have a structure in which the multiplication layer 120 and the absorption layer 130 are separated from each other.

The optical signal S condensed by the lens 50 passes through the multiplication layer 120 having a relatively wide band gap to reach the absorption layer 130. The multiplication layer 120 may be used as an opening through which the optical signal S is transmitted in case where the multiplication layer 120 has a band gap relatively greater than that of the absorption layer 130. When the absorption layer 130 includes an InGaAs layer, the InGaAs layer has a band gap of about 0.75 eV and may be sensitive to about 1.55 μm wavelength.

When the absorption layer 130 includes the InGaAs layer, and the multiplication layer 120 includes an InAlAs layer, a lattice matching between the InGaAs layer and the InAlAs layer may be improved.

The substrate 10 may include an InP substrate. An ohmic layer 100 for forming an ohmic electrode between the substrate 10 and the multiplication layer 120 is disposed. The ohmic layer 110 may include a $p^+$InGaAsP layer. An n-type electrode 115 may be disposed in the ohmic layer 110. A current movement layer 140 for speedily moving a current is disposed on the absorption layer 130. The current movement layer 140 may include an $n^-$-InGaAs layer. A p-type electrode 150 may be disposed on the current movement layer 140. The p-type electrode 150 and the n-type electrode 115 may be formed of one of titanium (Ti), platinum (Pt), and gold (Au).

Since the absorption layer 130 may include the InGaAs layer having a relatively narrow band gap, an electric filed may not be easily adjusted. According to an embodiment of the present invention, the multiplication layer 120 may be disposed to reduce a density of an electric field in the absorption layer 130, thereby reducing a leakage current.

The hetero-junction bipolar transistor 200 includes a sub-collector layer 230 on the substrate 10, a collector layer 240 on the sub-collector layer 230, a base layer 250 on the collector layer 240, an emitter layer 260 on the base layer 250. The sub-collector layer 230 may be formed of the same material as the absorption layer 130. For example, the sub-collector layer 230 may include an $n^+$-InGaAs layer. The collector layer 240 may be formed of the same material as the current movement layer 140. For example, the collector layer 240 may include an $n^-$ InGaAs layer. The base layer 250 may include a $p^+$ InGaAs layer, and the emitter layer 260 may include an $n^-$ InP layer.

An emitter ohmic layer 270 is disposed on the emitter layer 260, and an emitter electrode 275 is disposed on the emitter ohmic layer 270. The emitter ohmic layer 270 may include an $n^+$ InGaAs layer. A base electrode 255 may be disposed on a top surface of the base layer 250, and a collector electrode 235 may be disposed on a top surface of the sub-collector layer 230. The base electrode 255, the collector electrode 235, and the emitter electrode 275 may be formed of one of Ti, Pt, and Au.

A first dummy layer 210 may be disposed between the sub-collector layer 230 and the substrate 10. The first dummy layer 210 may be formed of the same material as the ohmic layer 110. A second dummy layer 220 may be disposed between the first dummy layer 210 and the sub-collector layer 230. The second dummy layer 210 may be formed of the same material as the multiplication layer 120. That is, the second dummy layer 220 may include a p-type InAlAs layer 222 and an n-type InAlAs layer 224.

An optical current generated in the photo detector 100 may be injected into the base layer 250 and multiplied by the hetero-junction bipolar transistor 200.

For this, the p-type electrode of the photo detector 100 may be electrically connected to the base electrode 255 of the hetero-junction bipolar transistor 200. Thus, the optical receiver in which the photo detector 100 and the hetero-junction bipolar transistor 200 are integrated may have a high multiplication characteristic. Also, since an optical fiber aligned to the optical receiver is disposed on the backside of the planar substrate 10, the photo detector 100 may be easily aligned to the optical fiber. A protection layer 190 for protecting surfaces of the optical fiber and the hetero-junction bipolar transistor 200 and electrically connecting the optical fiber to the hetero-junction bipolar transistor 200 is disposed. The protection layer 190 may include a polymer. Also, to electrically connect the optical fiber to the hetero-junction bipolar transistor 200, at least portions of the p-type electrode 150, the n-type electrode 115, the base electrode 255, the emitter electrode 275, and the collector electrode 235 may be exposed.

According to an embodiment of the present invention, the lens 50 may be provided on the backside of the substrate 10 to improve the external quantum efficiency. In addition, since the photo detector 100 has the structure in which the multiplication layer 120 and the absorption layer 130 are separated from each, the leakage current may be minimized. Since the optical current generated from the photo detector 100 is transmitted to the base electrode 255, the optical receiver may have the high multiplication characteristic.

Figure 2B:
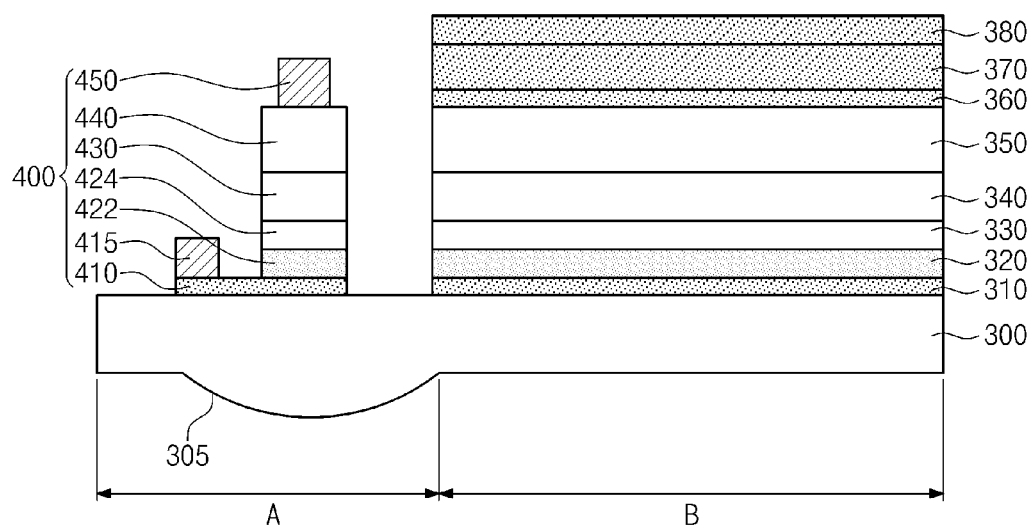
Figure 2C:
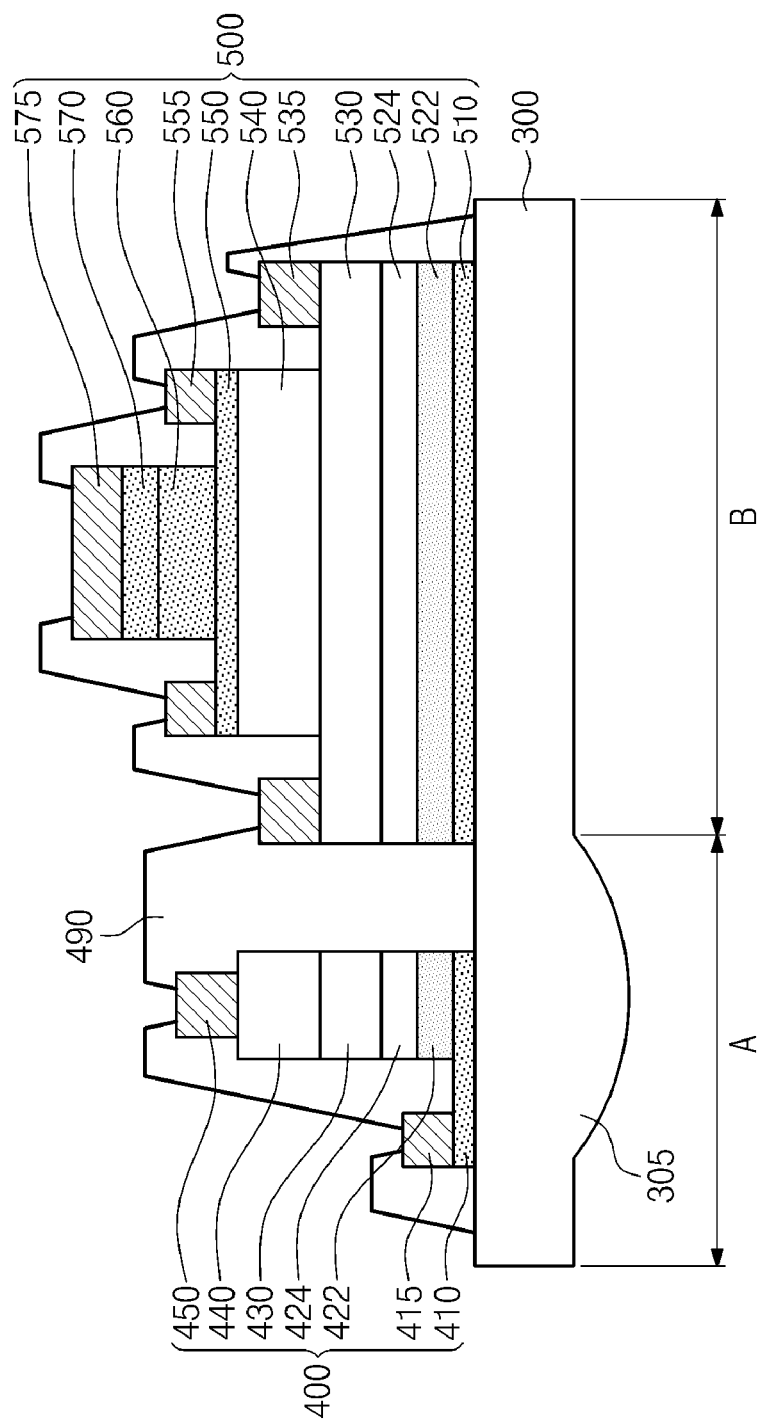

FIGS. 2A to 2C are views illustrating a method of forming an optical receiver according to an embodiment of the present invention.

Referring to FIG. 2A, a substrate 300 including a first region A and a second region B is prepared. A lens 305 is integrated in the first region A. The lens 305 may be formed of the same material as the substrate 300. The lens 305 and the substrate 300 may be formed of InP. The lens 305 may condense an optical signal to improve external quantum efficiency. A $p^+$-type InGaAsP layer 310 is formed in the first region A and the second region B of the substrate 300. A $p^+$-type InAlAs layer 320 is formed on the $p^+$-type InGaAsP layer 310. An $n^+$-type InAlAs layer 330 is formed on the $p^+$-type InAlAs layer 320. An $n^+$-type InGaAs layer 340 is formed on the $n^+$-type InAlAs layer 330. An $n^-$-type InGaAs layer 350 is formed on the $n^+$-type InGaAs layer 340. A $p^+$-type InGaAs layer 360 is formed on the $n^-$-type InGaAs layer 350. An $n^-$-type InP layer 370 is formed of the $p^+$-type InGaAs layer 360. An $n^+$-type InGaAs layer 380 is formed on the $n^-$-type InP layer 370.

A metal organic chemical vapor deposition process may be performed to form the $p^+$-type InGaAsP layer 310, the $p^+$-type InAlAs layer 320, the $n^+$-type InAlAs layer 330, the $n^+$-type InGaAs layer 340, the $n^-$-type InGaAs layer 350, the $p^+$-type InGaAs layer 360, the $n^-$-type InP layer 370, and the $n^+$-type InGaAs layer 380.

Referring to FIG. 2B, a photo detector 400 is formed in the first region A of the substrate 300. A process of forming the photo detector 400 may include the following process. The $p^+$-type InGaAsP layer 310 of the first region A is patterned to form an ohmic layer 410. The $p^+$-type InAlAs layer 320 and the $n^+$-type InAlAs layer 330 are patterned to form a p-type multiplication layer 422 and an n-type multiplication layer 424. The $n^+$-type InGaAs layer 340 is patterned to form an absorption layer 430. The $n^-$-type InGaAs layer 350 is patterned to form a current movement layer 440. An n-type electrode 415 is formed on an exposed top surface of the ohmic layer 410. A p-type electrode 450 is formed on the current movement layer 440. A lift-off process may be performed to form the n-type electrode 415 and the p-type electrode 450. The n-type electrode 415 and the p-type electrode 450 may be formed of one of Ti, Pt, and Au.

Referring to FIG. 2C, a hetero-junction bipolar transistor 500 is formed in the second region B of the substrate 300. The $p^+$-type InGaAsP layer 310 of the second region B is patterned to form a first dummy layer 510. The $p^+$-type InAlAs layer 320 and the $n^+$-type InAlAs layer 330 are patterned to form a p-type dummy layer 522 and an n-type dummy layer 524. The $n^+$-type InGaAs layer 340 is patterned to form a sub-collector layer 530. The $n^-$-type InGaAs layer 350 is patterned to form a collector layer 540.

The $p^+$-type InGaAs layer 360 is patterned to form a base layer 560 on the collector layer 540 of the second region B. The $n^-$-type InP layer 370 is patterned to form an emitter layer 570 on the base layer 560. The $n^+$-type InGaAs layer 380 is patterned to form an emitter ohmic layer 570 on the emitter layer 570.

An emitter electrode 575 is formed on the emitter ohmic layer 570. A base electrode 555 is formed on the base layer 550. A collector electrode 535 is formed on the sub-collector layer 530. The lift-off process may be performed to simultaneously form the emitter electrode 575, the base electrode 555, and the collector electrode 535. The emitter electrode 575, the base electrode 555, and the collector electrode 535 may be formed of one of Ti, Pt, and Au.

There is formed a protection layer 490 for protecting surfaces of the photo detector 400 and the hetero-junction bipolar transistor 500 and electrically connecting the photo detector 400 to the hetero-junction bipolar transistor 500. The protection layer 490 may include a polymer. Also, to electrically connect the photo detector 400 to the hetero-junction bipolar transistor 500, at least portions of the p-type electrode 450, the n-type electrode 415, the base electrode 455, the emitter electrode 475, and the collector electrode 435 may be exposed.

According to an embodiment of the present invention, one metal organic chemical vapor deposition process may be performed to form the photo detector 400 and the hetero-junction bipolar transistor 500. Thus, it is not necessary to perform a crystal growing process several times in the process of manufacturing the photo detector.

According to an embodiment of the present invention, the optical receiver in which the photo detector and the hetero-junction bipolar transistor are integrated includes the lens for condensing the optical signal. The optical receiver can have the improved external quantum efficiency due to the lens. Also, since the multiplication layer and the absorption layer of the photo detector can be separated from each other to realize the multiplication the optical current, the leakage current can be reduced. Since the optical current generated from the photo detector is transmitted to the base electrode, the photo detector can have the high multiplication characteristic.

According to an embodiment of the present invention, the photo detector and the hetero-junction bipolar transistor of the optical receiver can be simultaneously manufactured to reduce the manufacturing costs.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An optical receiver, comprising:
    a substrate;
    a lens disposed on a backside of the substrate, the lens condensing an optical signal incident therethrough;
    a photo detector disposed on a top surface of the substrate, the photo detector absorbing the condensed optical signal incident through the lens to generate an electric current; and
    a hetero-junction bipolar transistor disposed on the top surface of the substrate, the hetero-junction bipolar transistor being in electrical connection with the photo detector and multiplying the electric current generated by the photo detector, wherein the photo detector includes a multiplication layer and an absorption layer, the multiplication layer being formed on the top surface of the substrate, and the absorption layer being formed on the multiplication layer.

2. The optical receiver of claim 1, wherein the multiplication layer includes a p-type InAlAs layer and an n-type InAlAs layer, the p-type InAlAs layer being formed on the top surface of the substrate, and the n-type InAlAs layer being formed on the p-type InAlAs layer.

3. The optical receiver of claim 1, wherein the absorption layer comprises an n-type InGaAs layer.

4. The optical receiver of claim 1, wherein the photo detector further comprises:
   an ohmic layer disposed between the substrate and the multiplication layer, the ohmic layer being formed of p-type InGaAsP; and
   a current movement layer disposed on the absorption layer, the current movement layer being formed of n-type InGaAs.

5. The optical receiver of claim 1, wherein the heterojunction bipolar transistor comprises:
   a sub-collector layer disposed on the substrate; and
   a collector layer disposed on the sub-collector layer,
   wherein the sub-collector layer is formed of the same material as the absorption layer, and the collector layer is formed of the same material as the current movement layer.

6. The optical receiver of claim 5, wherein the heterojunction bipolar transistor further includes two layers disposed between the sub-collector layer and the substrate, one of the two layers being formed of the same material as the ohmic layer, and the other of the two layers being formed of the same material as the multiplication layer.

* * * * *